United States Patent [19]
O'Handley et al.

[11] Patent Number: 6,057,766
[45] Date of Patent: May 2, 2000

[54] IRON-RICH MAGNETOSTRICTIVE ELEMENT HAVING OPTIMIZED BIAS-FIELD-DEPENDENT RESONANT FREQUENCY CHARACTERISTIC

[75] Inventors: Robert C. O'Handley, Andover, Mass.; Wing K. Ho, Boynton Beach, Fla.; Ming-Ren Lian, Boca Raton, Fla.; Nen-Chin Liu, Parkland, Fla.

[73] Assignee: Sensormatic Electronics Corporation, Boca Raton, Fla.

[21] Appl. No.: 09/165,566

[22] Filed: Oct. 2, 1998

Related U.S. Application Data

[63] Continuation-in-part of application No. 08/800,771, Feb. 14, 1997, Pat. No. 5,949,334, and a continuation-in-part of application No. 08/800,772, Feb. 14, 1997, Pat. No. 5,825,290.

[51] Int. Cl.[7] ................................................. G08B 13/14
[52] U.S. Cl. ................................... 340/572.6; 340/572.1; 148/121
[58] Field of Search ............................ 340/572.1, 572.6; 148/121; 29/605; 360/113

[56] References Cited

U.S. PATENT DOCUMENTS

| | | | |
|---|---|---|---|
| 5,252,144 | 10/1993 | Martis | 148/121 |
| 5,628,840 | 5/1997 | Hasegawa | 148/304 |
| 5,923,504 | 7/1999 | Araki et al. | 360/113 |
| 5,935,347 | 8/1999 | Suzuki et al. | 148/121 |

FOREIGN PATENT DOCUMENTS

WO9003652  4/1990  WIPO.

OTHER PUBLICATIONS

Ohnuma, et al., "Magnetic Properties of (Fe, Co. and Ni)—Zr Amorphous Alloys", *IEEE Transactions on Magnetics*, vol. Mag. 16, No. 5, Sep. 1980, 99. 1129–1131.

Yoshino, et al., "Low Magnetostrictive Amorphous Fe–Nb–Si–B Alloys", *J. Appl. Phys.*, vol. 55, No. 6, Mar. 1984, pp. 1751–1753.

Corb, et al., "Magnetic Moments and Bonding in Co–Nb–B Alloys", *Journal of Magnetism and Magnetic Materials*, vol. 31, No. 34, 1983, pp. 1537–1539.

Inomata, et al., "Magnetostriction and Related Properites in Amorphous Fe–Nb–Si–B Alloys", *Journal of Magnetism and Magnetic Materials*, vol. 31, No. 34, 1983, pp. 1577–1578.

Hasegawa, et al., "Iron–boron Metallic Glasses", *J. Appl. Phys.*, vol. 49, No. 7, Jul. 1978, pp. 4174–4179.

Squire, "Phenomenological Model for Magnetization, Magnetostriction and ΔE Effect in Field–Annealed Amorphous Ribbons", *Journal of Magnetism and Magnetic Materials*, vol. 87, 1990, pp. 299–310.

Mermelstein, et al., "Dynamic Sensitivity and Thermal Noise Analysis of a Magnetoelastic Amorphous Metal Low–Frequency Magnetometer", *Appl. Phys. Lett.*, vol. 51, No. 20, Nov. 16, 1987, pp. 1640–1642.

(List continued on next page.)

*Primary Examiner*—Benjamin C. Lee
*Attorney, Agent, or Firm*—Robin, Blecker & Daley

[57] ABSTRACT

A magnetostrictive element for use in a magneto-mechanical marker has a resonant frequency characteristic that is at a minimum at a bias field level corresponding to the operating point of the magnetomechanical marker. The magnetostrictive element has a magnetomechanical coupling factor k in the range 0.28 to 0.4 at the operating point. The magnetostrictive element is formed by applying cross-field annealing to an iron-rich amorphous metal alloy ribbon (45 to 82 percent iron) which includes a total of from 2 to 17 percent of one or more of Mn, Mo, Nb, Cr, Hf, Zr, Ta, V. Cobalt, nickel, boron, silicon and/or carbon may also be included. The metal alloy may include one early transition element selected from the group consisting of Zr, Hf and Ta, and also a second early transition element selected from the group consisting of Mn, Mo, Nb, Cr, and V.

72 Claims, 6 Drawing Sheets

OTHER PUBLICATIONS

Mermelstein, et al., "Low–Frequency Magnetic Field Detection with a Magnetostrictive Amorphous Metal Ribbon", *Appl. Phys. Lett.*, vol. 51, No. 17, Aug. 17, 1987, pp. 545–547.

Davis, et al., "Metallic Glasses as Magnetomechanical Materials", *Key Engineering Materials*, vol. 13, No. 15, 1987, pp. 733–748.

O'Handley, "Magnetic Materials for EAS Sensors", *Journal of Materials Engineering and Performance*, vol. 2(2), Apr. 1993, pp. 211–218.

Livingston, "Magnetomechanical Properties of Amorphous Metals", *Phys. Stat. Sol.*, vol. 70, 1982, pp. 591–596.

Copeland, et al., "Analysis of a Magnetoelastic Sensor", *IEEE Transactions on Magnetics*, vol. 30, No. 5, Sep. 1994, pp. 3399–3402.

Spano, et al., "Magnetostriction and Magnetic Anisotropy of Field Annealed Metglas* 2605 Alloys Via dc M–H Loop Measurements Under Stress", *J. Appl. Phys.*, vol. 53, No. 3, Mar. 1982, pp. 2667–2669.

Savage, et al., "Perpendicular Susceptibility, Magnetomechanical Coupling and Shear Modulus in $Tb_{.27}Dy_{.73}Fe_2$", *IEEE Transactions on Magnetics*, vol. Mag. 14, (No.5), Sep. 1978, pp. 545–547.

Mermelstein, "Magnetoelastic Amorphous Metal Fluxgate Magnetometer", (citation unknown), 1986.

Resonant Frequency

Bias Field ⟶ k

Bias Field ⟶

SATURATION MAGNETIZATION DATA (0°K)

Tc DATA
$(Fe, Co, Ni)_{90}Zr_{10}$

IRON-RICH MAGNETOSTRICTIVE ELEMENT HAVING OPTIMIZED BIAS-FIELD-DEPENDENT RESONANT FREQUENCY CHARACTERISTIC

CROSS-REFERENCE TO RELATED APPLICATIONS

This is a continuation-in-part of prior applications Ser. No. 08/800,771 now U.S. Pat. No. 5,949,334, and Ser. No. 08/800,772 now U.S. Pat. No. 5,825,290, both filed Feb. 14, 1997. The entire disclosure of the '771 and '772 applications is hereby incorporated herein by reference.

FIELD OF THE INVENTION

This invention relates to active elements to be used in markers for magnetomechanical electronic article surveillance (EAS) systems, and more particularly to alloys of which such active elements may be formed.

BACKGROUND OF THE INVENTION

U.S. Pat. No. 4,510,489, issued to Anderson et al., discloses a magnetomechanical EAS system in which markers incorporating a magnetostrictive active element are secured to articles to be protected from theft. The active elements are formed of a soft magnetic material, and the markers also include a control element (also referred to as a "bias element") which is magnetized to a pre-determined degree so as to provide a bias field which causes the active element to be mechanically resonant at a pre-determined frequency. The markers are detected by means of an interrogation signal generating device which generates an alternating magnetic field at the pre-determined resonant frequency, and the signal resulting from the magnetomechanical resonance is detected by receiving equipment.

According to one embodiment disclosed in the Anderson et al. patent, the interrogation signal is turned on and off, or "pulsed", and a "ring-down" signal generated by the active element after conclusion of each interrogation signal pulse is detected.

The disclosure of the Anderson et al. patent is incorporated herein by reference.

Typically, magnetomechanical markers are deactivated by degaussing the control element, so that the bias field is removed from the active element, thereby causing a substantial shift in the resonant frequency of the active element. This technique takes advantage of the fact that the resonant frequency of the active element varies according to the level of the bias field applied to the active element. Curve 20 in FIG. 1A illustrates a bias-field-dependent resonant frequency characteristic typical of certain conventional active elements used in magnetomechanical markers. The bias field level $H_B$ shown in FIG. 1A is indicative of a level of bias field provided usually by the control element when the magnetomechanical marker is in its active state. The bias field level $H_B$ is sometimes referred to as the operating point. Conventional magnetomechanical EAS markers operate with a bias field of about 6 Oe to 7 Oe.

When the control element is degaussed to deactivate the marker, the resonant frequency of the active element is substantially shifted (increased) as indicated by arrow 22. In conventional markers, a typical frequency shift upon deactivation is on the order of 1.5 kHz to 2 kHz. In addition, there is usually a substantial decrease in the amplitude of the "ring-down" signal.

U.S. Pat. No. 5,469,140, which has common inventors and a common assignee with the present application, discloses a procedure in which a strip of amorphous metal alloy is annealed in the presence of a saturating transverse magnetic field. The resulting annealed strip is suitable for use as the active element in a magnetomechanical marker and has improved ring-down characteristics which enhance performance in pulsed magnetomechanical EAS systems. The active elements produced in accordance with the '140 patent also have a hysteresis loop characteristic which tends to eliminate or reduce false alarms that might result from exposure to harmonic-type EAS systems. The disclosure of the '140 patent is incorporated herein by reference.

Referring again to curve 20 in FIG. 1A, it will be noted that the curve has a substantial slope at the operating point. As a result, if the bias field actually applied to the active element departs from the nominal operating point $H_B$, the resonant frequency of the marker may be shifted to some extent from the nominal operating frequency, and may therefore be difficult to detect with standard detection equipment. U.S. Pat. No. 5,568,125, which is a continuation-in-part of the aforesaid '140 patent, discloses a method in which a transverse-field-annealed amorphous metal alloy strip is subjected to a further annealing step to reduce the slope of the bias-field-dependent resonant frequency characteristic curve in the region of the operating point. The disclosure of the '125 patent is incorporated herein by reference.

The techniques disclosed in the '125 patent reduce the sensitivity of the resulting magnetomechanical markers to variations in bias field without unduly diminishing the overall frequency shift which is desired to take place upon degaussing the control element. Although the teachings of the '125 patent represent an advance relative to manufacture of transverse-annealed active elements, it would be desirable to provide magnetomechanical EAS markers exhibiting still greater stability in resonant frequency.

The above-referenced co-pending '771 application discloses certain annealing techniques and certain preferred alloy compositions which may be utilized to obtain active elements having improved stability in terms of resonant frequency relative to changes in bias field. According to the disclosure which follows, additional alloy compositions are disclosed which also should provide favorable resonant frequency stability and can be manufactured at low cost.

OBJECTS AND SUMMARY OF THE INVENTION

It is an object of the invention to provide low-cost magnetomechanical EAS markers that are stable in terms of resonant frequency relative to changes in bias field.

According to an aspect of the invention, there is provided a magnetomechanical EAS marker, including an active element in the form of a strip of amorphous magnetostrictive metal alloy having a composition consisting essentially of $Fe_aCo_bNi_cM_dB_eSi_fC_g$, and an element for applying a bias magnetic field at a level $H_B$ to the active element, $H_B$ being greater than 3 Oe, and the active element having been annealed to relieve stress therein and having a magnetomechanical coupling factor k at the bias level $H_B$, such that $0.28 \leq k \leq 0.4$; with $45 \leq a \leq 82$; $0 \leq b \leq 40$; $0 \leq c \leq 30$; $2 \leq d \leq 17$; $0 \leq e \leq 28$; $0 \leq f \leq 8$; $0 \leq g \leq 4$ (a–g in atomic percent); and M is one or more of Mn, Mo, Nb, Cr, Hf, Zr, Ta, V; provided that (i) the combined proportion of Mn, Mo, Nb, Cr, Ta, V, if present, does not exceed 10%; and (ii) the combined proportion of Zr and Hf, if present, does not exceed 15%.

According to a further aspect of the invention, the composition of such an active element may consist essentially of $Fe_aM1_bM2_cM3_dC_e$, with M1 being one or both of Co and Ni; M2 being one or more of Mn, Mo, Nb, Cr, Hf, Zr, Ta, V; M3 being one or both of B and Si; $50 \leq a \leq 75$; $15 \leq b \leq 35$; $3 \leq c \leq 12$; $0 \leq d \leq 20$; $0 \leq e \leq 4$ (a–e in atomic percent).

According to yet another aspect of the invention, the composition of such an active element may consist essentially of $Fe_aM_bB_cSi_dC_e$, with M being one or more of Mn, Mo, Nb, Cr, Hf, Zr, Ta, V; $70 \leq a \leq 80$, $2 \leq b \leq 8$; $6 \leq c \leq 15$; $0 \leq d \leq 4$; $0 \leq e \leq 4$ (a–e in atomic percent).

According to further aspects of the invention, the composition of the active element may be one of the following:

(A) $(FeNiCo)_{100-x-z}TE1_xM_z$; with $5 \leq x \leq 16$ and $0 \leq z \leq 12$; provided that:
  (i) the proportion of Fe is at least $0.4 \times (100-x-z)$;
  (ii) the proportion of Co is less than $0.4 \times (100-x-z)$; and
  (iii) the proportion of Ni is less than $0.4 \times (100-x-z)$;

(B) $(FeNiCo)_{100-y-z}TE2_yM_z$; with $2 \leq y \leq 14$; $4 \leq z \leq 16$ and $y+z \leq 25$; provided that the proportion of Fe is at least two-thirds of $(100-y-z)$; or (C) $(FeNiCo)_{100-x-y-z}TE1_xTE2_yM_z$; with $5 \leq x \leq 16$; $2 \leq y \leq 12$; $4 \leq z \leq 16$; $x+y \leq 20$; $x+y+z \leq 30$; provided that the proportion of Fe is at least $0.4 \times (100-x-y-z)$;

where:
(1) all proportions are stated in terms of atomic percent;
(2) TE1 is one or more of Zr, Hf, Ta;
(3) TE2 is one or more of Cr, Nb, Mo, Mn, V; and
(4) M is one or more of B, Si, Ge, C and P.

DESCRIPTION OF PREFERRED EMBODIMENTS AND PRACTICES

Figure 1A:
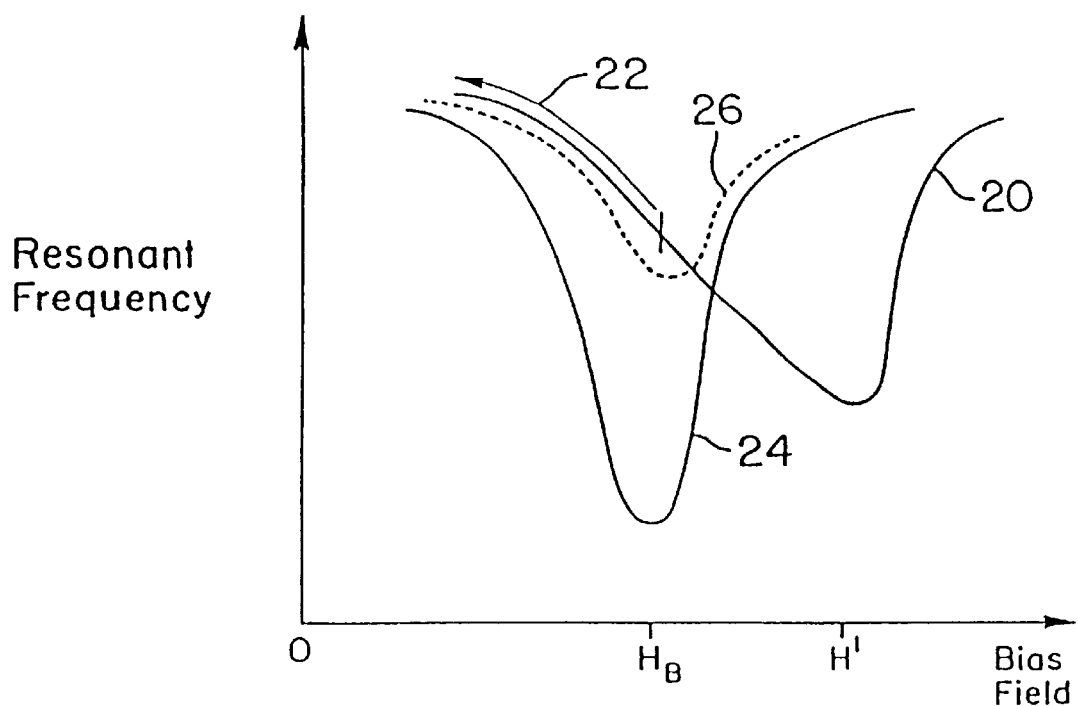
FIG. 1A illustrates bias-field-dependent resonant frequency characteristics of magnetomechanical markers provided in accordance with conventional practice and in accordance with the present invention.

Referring again to FIG. 1A, it will be observed that the resonant frequency characteristic curve 20 of the prior art transverse-field-annealed active element has a minimum at a bias field value of about H'. The value of H' substantially corresponds to the anisotropy field ($H_a$), which is the longitudinal field required to overcome the transverse anisotropy formed by transverse-field annealing. A typical level for H' (the level corresponding to the minimum resonant frequency) for the conventional transverse-field-annealed active elements is around 11 Oe to 15 Oe.

It could be contemplated to change the operating point to the bias field level H' corresponding to the minimum of the characteristic curve 20. In this case, variations in the effective bias field would not cause a large change in resonant frequency, since the slope of the characteristic curve 20 is essentially zero at its minimum, and is otherwise at a low level in the region around H'. There are, however, practical difficulties which would prevent satisfactory operation at H' with the conventional transverse-field-annealed active element.

The most important difficulty is related to the magnetomechanical coupling factor k of the active element if biased at the level H'. As seen from FIGS. 1B and 1C, the coupling factor k has a peak (FIG. 1C), at substantially the same bias level at which the resonant frequency has its minimum (FIG. 1B; the horizontal scales indicative of the bias field level are the same in FIGS. 1B and 1C). The solid line portion of the curves shown in FIGS. 1B and 1C corresponds to theoretical models, as well as measured values, for the well of the resonant frequency and the peak of the coupling factor k. The dotted line portion of the curves shows a rounded minimum of the frequency curve and a rounded peak of the coupling factor as actually measured and contrary to the theoretical model. For the conventional transverse-field-annealed material, the peak coupling factor k is about 0.45, which is significantly above the optimum coupling factor 0.3. With a coupling factor k at 0.45, the so-called "quality factor" or Q of the active element would be substantially lower than at the conventional operating point $H_B$ so that the active element, when resonating, would dissipate energy much more rapidly, and therefore would have a lower ring-down signal which could not be detected with conventional pulsed-field detection equipment.

Moreover, the bias element that would be required to provide the higher level bias field H' would be larger and more expensive than conventional bias elements, and more prone to magnetically clamp the active element, which would prevent the marker from operating.

The difficulties that would be caused by the larger bias element could be prevented by changing the annealing process applied to form the conventional transverse-field-annealed active element so that the anisotropy field $H_a$ substantially corresponds to the conventional operating point $H_B$. The resulting resonant frequency characteristic is represented by curve 24 in FIG. 1A. Although this characteristic exhibits a minimum and zero slope at or near the conventional operating point, the frequency "well" has very steep sides so that a minor departure of the bias field from the nominal operating point could lead to significant variations in resonant frequency. Furthermore, the peak level of the coupling factor k which corresponds to the frequency minimum of the characteristic curve 24 is substantially above the optimum level 0.3, resulting in fast ring-down and an unacceptably low ring-down signal amplitude.

Figure 1B:
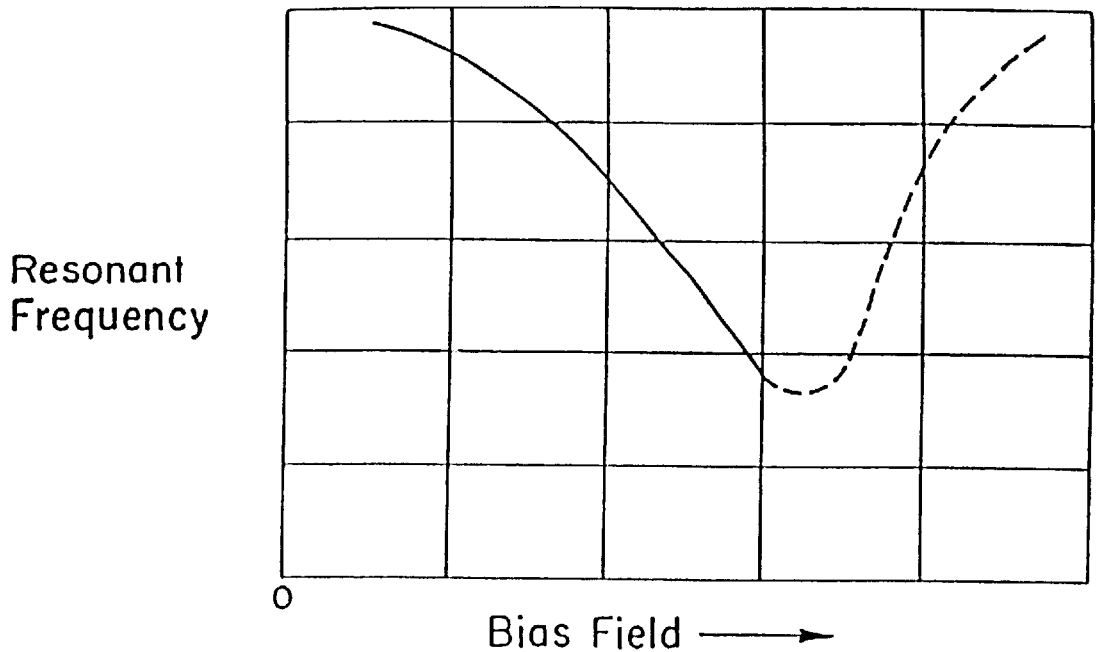
FIGS. 1B and 1C illustrate, respectively, a resonant frequency characteristic, and a magnetomechanical coupling factor (k) characteristic, of a magnetostrictive element provided in accordance with the invention.

According to examples provided below, a novel active element is to be formed that has a resonant frequency characteristic such as that represented by dotted line curve 26 of FIG. 1A, with a minimum at or near the conventional operating point $H_B$ and a coupling factor k at or near the optimum 0.3 at the operating point.

In brief, it is proposed in accordance with the invention to apply a conventional cross-field annealing process as in the '140 patent to ribbons of amorphous alloy compositions that have not previously been employed as annealed magnetostrictive elements in magnetomechanical EAS markers.

As noted above, it has been found that a magnetomechanical coupling factor k of 0.3 corresponds to a maximum ring-down signal level. For k in the range 0.28 to 0.40 satisfactory signal amplitude is also provided. If k is greater than 0.4, the output signal amplitude is substantially reduced, and if k is much less than 0.3 the initial signal level produced by the interrogation pulse is reduced, again leading to reduced ring-down output level. A preferred range for k is about 0.30 to 0.35.

It has been shown that for a material having a transverse anisotropy, the coupling coefficient k is related to the magnetization $M_S$ at saturation, the magnetostriction coefficient $\lambda_S$, the anisotropy field $H_a$, Young's modulus at saturation $E_M$, and the applied longitudinal field H according to the following equation:

$$k^2 = \frac{9\lambda_S^2 E_M H^2}{M_S H_a^3 + 9\lambda_S^2 E_M H^2} \quad (1)$$

This relationship is described in "Magnetomechanical Properties of Amorphous Metals," J. D. Livingston, *Phys. Stat. Sol.*, (a) 70, pp. 591–596 (1982).

Figure 1C:
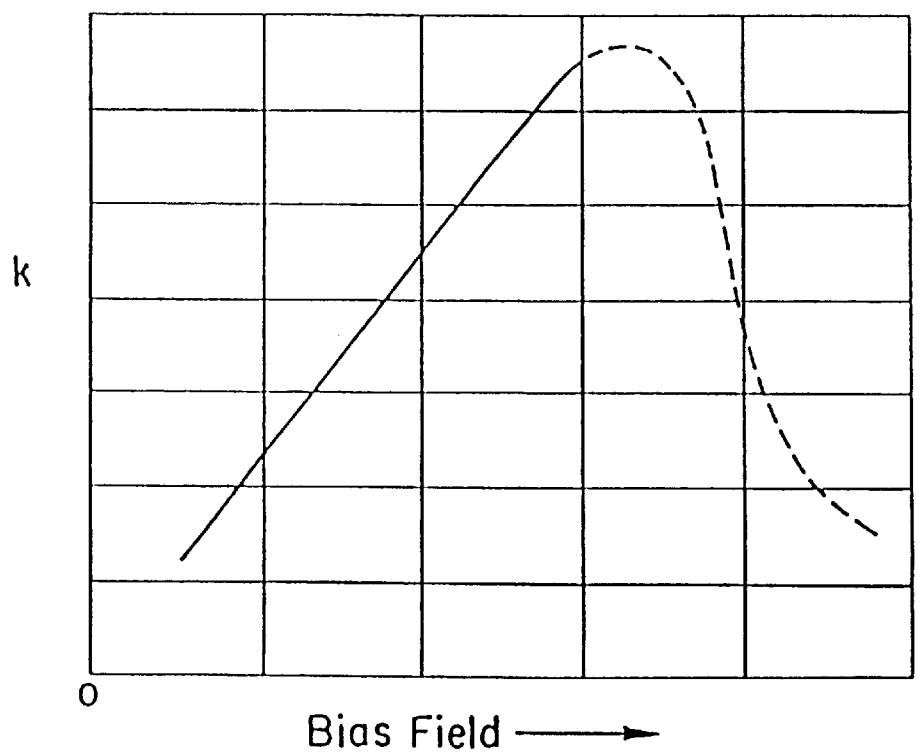

The relationship represented by Equation (1) holds only for values of H less than or equal to $H_a$, above which field level, in theory, k drops to zero. For real materials, however, the k characteristic exhibits a rounded peak of $H=H_a$ followed by a tail, as shown in FIG. 1C.

For amorphous materials used as active elements, $E_M$ has a value of about $1.2 \times 10^{12}$ erg/cm$^3$. The desired operating point implies a level of $H_a$ of 6 Oe. To produce an active element having the characteristic curve 26 shown in FIG. 1A, rather than the curve 24, it is desirable that k be in the range 0.28 to 0.4 when H approaches $H_a$. This requires a substantial reduction in k relative to the material that would have the characteristic represented by curve 24. Taking $E_M$, H, and $H_a$ as constants, it can be seen that k can be reduced by reducing the magnetostriction $\lambda_S$ and/or by increasing the magnetization $M_S$. Increasing the magnetization is also beneficial in that the output signal is also increased, but the level of saturation magnetization that is possible in amorphous magnetic material is limited.

Solving Equation (1) for the magnetostriction $\lambda_S$ yields the following relation:

$$\lambda_S = \frac{k\sqrt{M_S H_a^3}}{3H\sqrt{E_M(1-k^2)}} \quad (2)$$

For given values of k, H, $H_a$, $E_M$, it will be seen that the magnetostriction is proportional to the square root of the magnetization.

Taking H=5.5 Oe, and with $H_a$ and $E_M$ having the values noted before, FIG. 2 shows plots of magnetostriction versus magnetization for k=0.3 and k=0.4. A desirable region in the magnetostriction-magnetization space is indicated by the shaded region referenced at 36 in FIG. 2. The preferred region 36 lies between the curves corresponding to k=0.3 and k=0.4 at around $M_S$=1000 Gauss.

Figure 2:
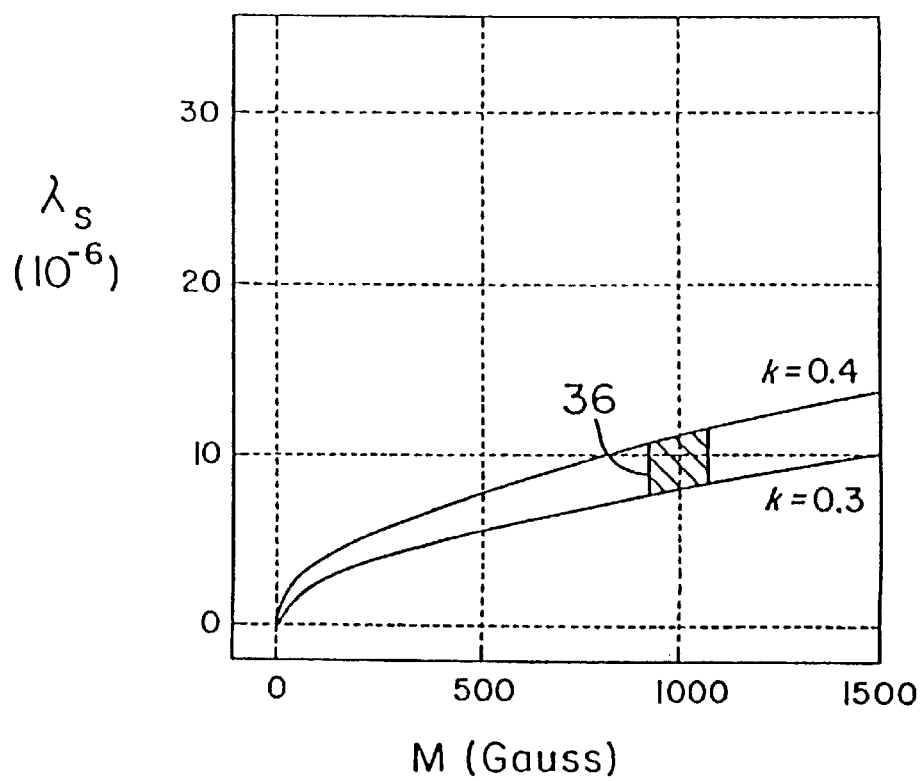
FIG. 2 illustrates a preferred range of the magnetomechanical coupling factor k in magnetostriction-magnetization space.
Figure 3:
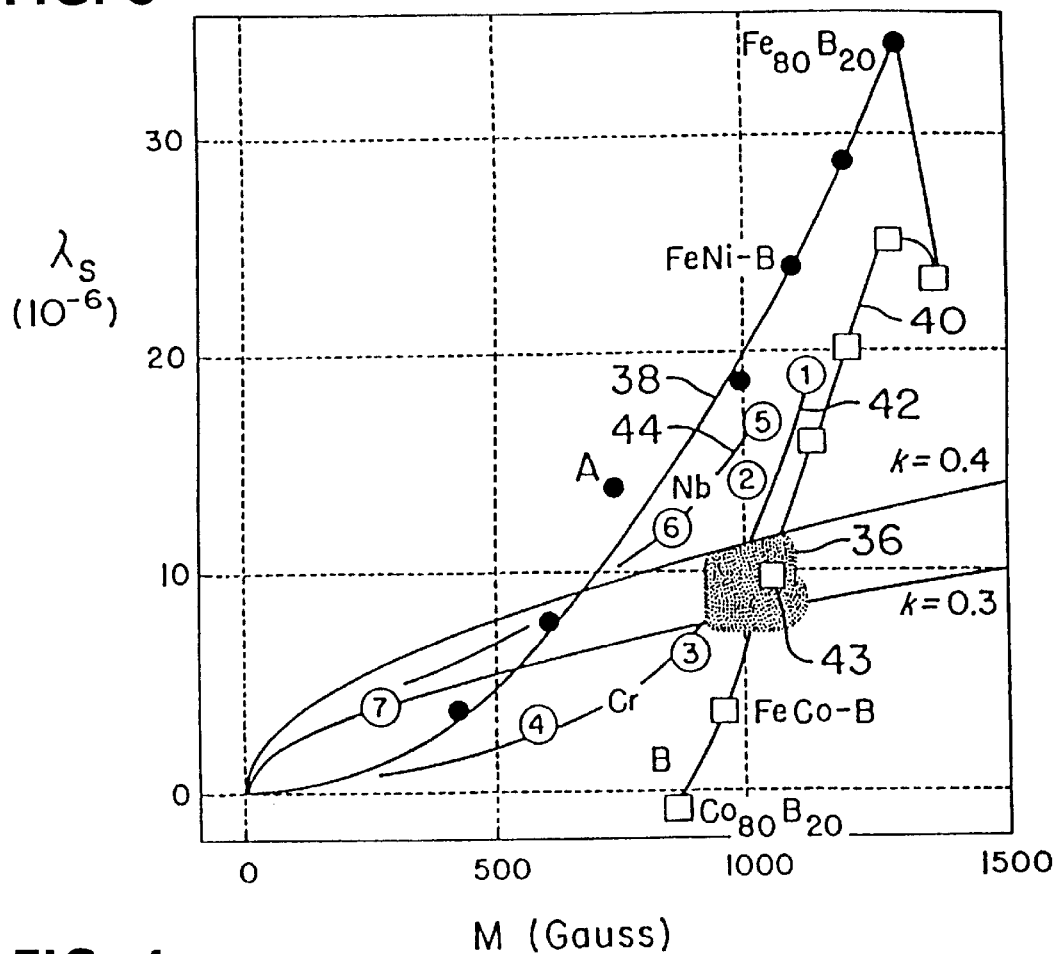
FIG. 3 adds to the illustration of FIG. 2 graphical representations of characteristics in magnetostriction-magnetization space of various alloy compositions.

FIG. 3 is similar to FIG. 2, with magnetostriction-magnetization characteristics of a number of compositions superimposed. Curve 38 in FIG. 3 represents a range of compositions from $Fe_{80}B_{20}$ to $Fe_{20}Ni_{60}B_{20}$. It will be observed that the FeNiB curve 38 misses the desired region 36 and can be expected to result in undesirably high levels of k in the region corresponding to the desired levels of magnetization. For example, the point labeled A corresponds to a composition known as Metglas 2826MB, which is about $Fe_{40}Ni_{38}Mo_4B_{18}$, and has an undesirably high coupling factor k. The 2826MB alloy is used as-cast (i.e., without annealing) as the active element in some conventional magnetomechanical markers. The casting process is subject to somewhat variable results, including variations in transverse anisotropy, so that in some cases the 2826MB material has a level of $H_a$ close to the conventional operating point, although $H_a$ for 2826MB as-cast is typically substantially above the conventional operating point.

The curve 40 corresponds to Fe—Co—B alloys and passes through the desired region 36. The point referred to at 43 on curve 40 is within the preferred region 36 and corresponds to $Fe_{20}Co_{60}B_{20}$. Although the latter composition can be expected to have a desirable coupling factor k at the preferred operating point, such a material would be quite expensive to produce because of the high cobalt content. It will be noted that at point B, which is approximately $Co_{74}Fe_6B_{20}$, there is substantially zero magnetostriction.

The data for curves 38 and 40 is taken from "Magnetostriction of Ferromagnetic Metallic Glasses", R. C. O'Handley, *Solid State Communications*, vol. 21, pages 1119–1120, 1977.

The present invention proposes that an amorphous metal alloy in the preferred region 36 be formed with higher iron and lower or no cobalt content by adding a quantity of one or more of the following early transition metals: Mn, Mo, Nb, Cr, Hf, Zr, Ta, V.

A curve 42 is defined by points 1, 2, 3, 4, and corresponds to a range of FeCrB alloys. These four points are, respectively, $Fe_{80}Cr_3B_{17}$; $Fe_{78}Cr_5B_{17}$; $Fe_{77}Cr_6B_{17}$; and $Fe_{73}Cr_{10}B_{17}$.

Curve 44 is defined by points 5–7 and corresponds to a range of FeNbB alloys. The points 5–7 shown on curve 44 are, respectively, $Fe_{80}Nb_3B_{17}$; $Fe_{78}Nb_5B_{17}$; and $Fe_{73}Nb_{10}B_{17}$. It will be noted that for the desired level of magnetization, the curves 42 and 44 are at a lower level of magnetostriction than the FeNiB curve 38. Point 6 on the FeNbB curve 44 provides substantially the same magnetostriction-magnetization characteristics as the alloy $Fe_{32}Co_{18}Ni_{32}B_{13}Si_5$ used to produce the transverse-field-annealed active elements according to the teachings of the above-referenced '125 patent.

Magnetization, magnetostriction and other characteristics of amorphous (Fe, Co, Ni)Zr alloys have been studied as reported in S. Ohnuma et al., "Magnetic Properties of (Fe, Co and Ni)—Zr Amorphous Alloys", *IEEE Transactions on Magnetics*, Vol. Mag-16, No. 5, Sep. 1980. Based on the reported characteristics and the optimal ranges for magnetostriction and magnetization as discussed hereinabove, the present inventors have devised iron-rich composition ranges that can be expected to exhibit a suitable coupling factor k after annealing and at a bias field level which corresponds to the minimum of the resonant frequency characteristic curve.

Figure 4:
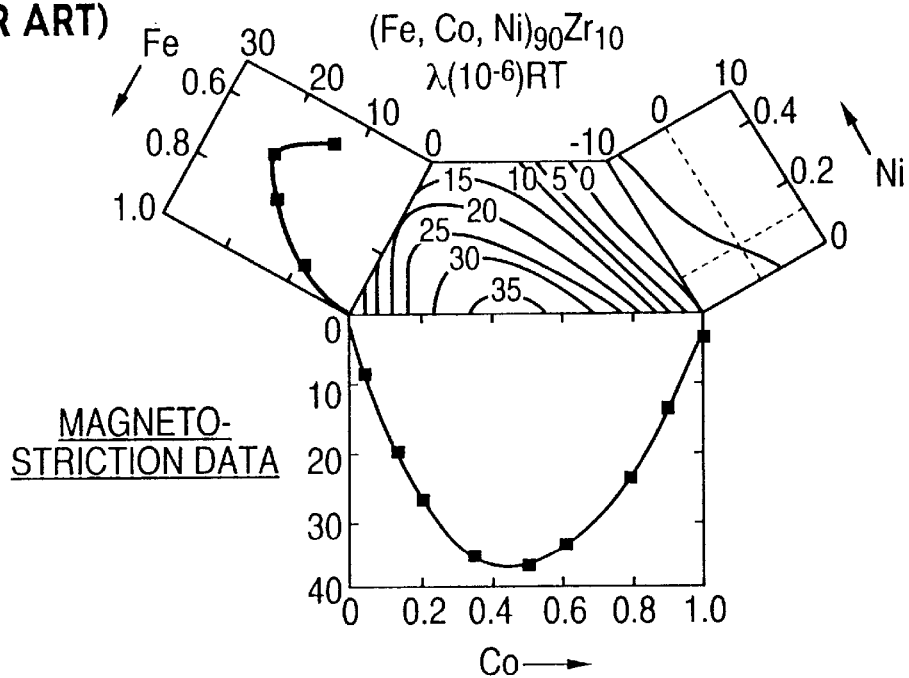
FIG. 4 is a diagram of magnetostriction data for an amorphous alloy in the $(Fe, Co, Ni)_{90}Zr_{10}$ system.

FIG. 4 is taken from the Ohnuma article, and shows how magnetostriction depends on composition in the (Fe, Co, Ni)$_{90}$Zr$_{10}$ system. Magnetostriction data for $Fe_{90}Zr_{10}$ is not included in this diagram because this alloy is not ferromagnetic at room temperature. At least 5 to 10% of Co or Ni is required to raise the Curie temperature Tc above room temperature. Little is lost by this requirement, given the rather low magnetostriction to be expected by extrapolation for $Fe_{90}Zr_{10}$.

Figure 5:
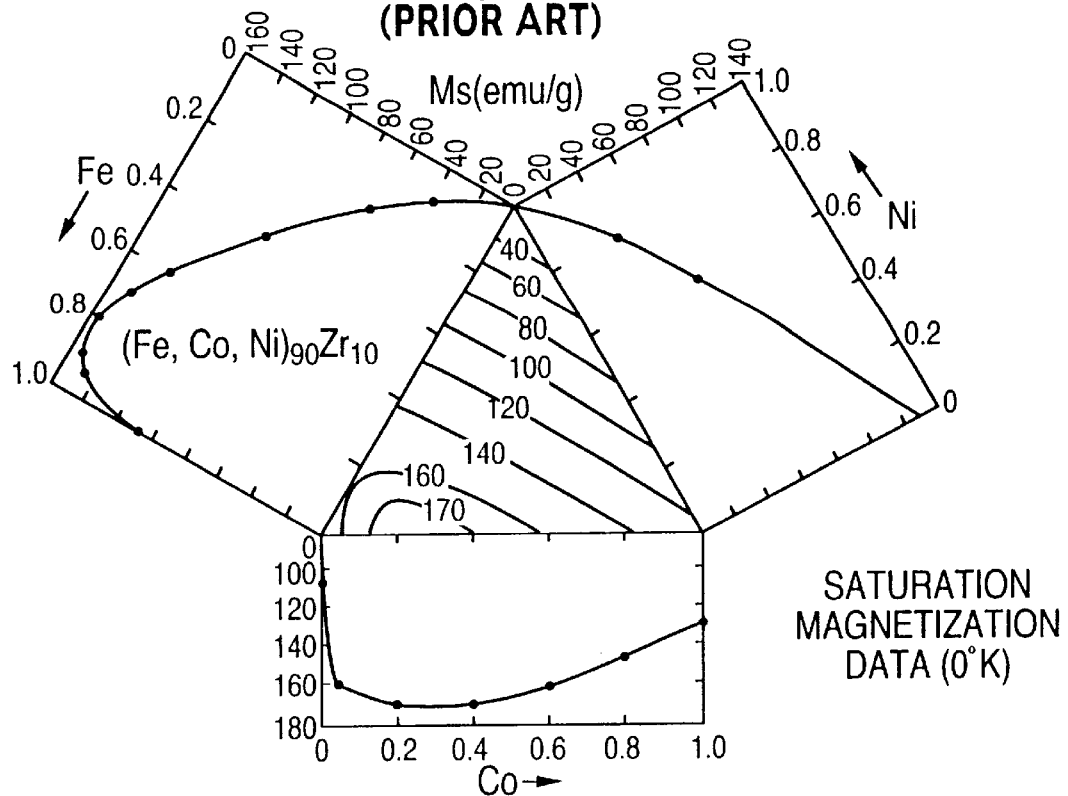
FIG. 5 is a diagram that is similar to FIG. 4, but showing saturation magnetization data.

FIG. 5, also taken from the Ohnuma article, shows how saturation magnetization at approximately absolute zero varies with composition for amorphous (Fe, Co, Ni)$_{90}$Zr$_{10}$ alloys. The foregoing discussion related to FIG. 2 indicated a "sweet spot" (shaded area 36) in terms of magnetization and magnetostriction characteristics that are required if an amorphous alloy is to have a suitable coupling factor k and a minimum resonant frequency at the conventional bias field level. The data of FIGS. 4 and 5 are useful in selecting (Fe, Ni, Co)-(early transition metal) compositions that have the required characteristics. However, another significant characteristic is the Curie temperature (Tc). In general, the higher the Curie temperature, the higher the saturation magnetization at room temperature. In addition, Tc must be sufficiently high to provide for enough atomic mobility to permit the desired cross-field annealing treatment.

Figure 6A:
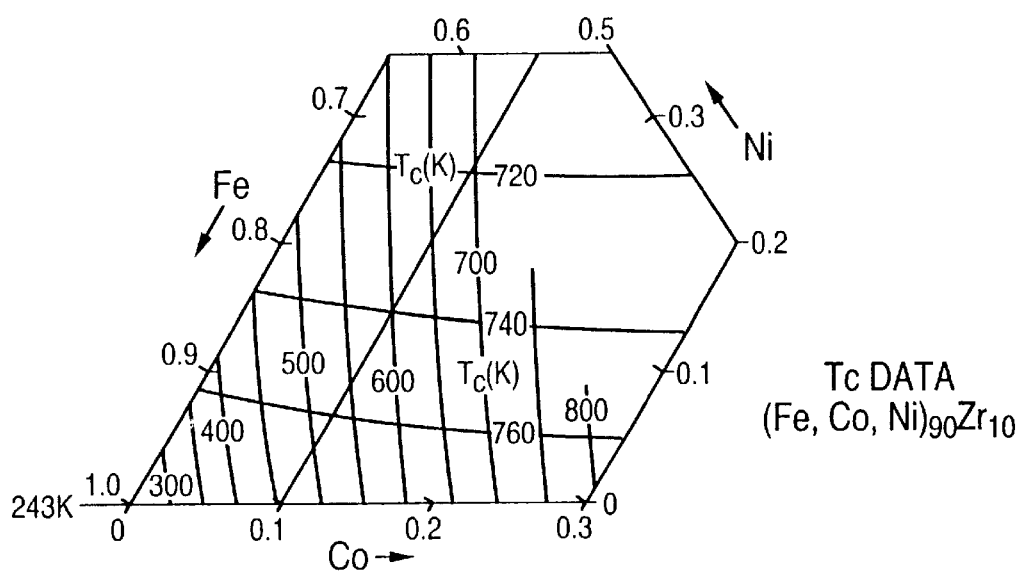
FIGS. 6A and 6B are ternary diagrams for amorphous $(FeCoNi)_{90}Zr_{10}$ showing Curie temperature (Tc) data.
Figure 6B:
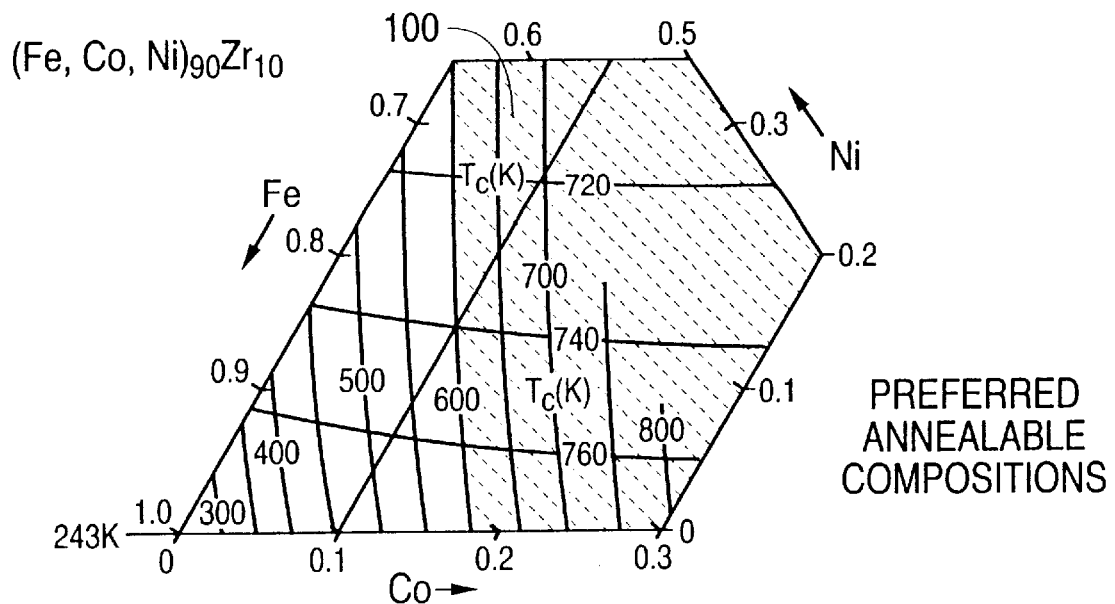

FIG. 6A, which also is from the Ohnuma article, presents data which shows how Tc varies with alloy composition in the amorphous (Fe, Co, Ni)$_{90}$Zr$_{10}$ system. FIG. 6B is the same as FIG. 6A, but with shading 100 to indicate a desirable range of compositions for which Tc$\geq$600° K. If Tc is less than about 600° K., it may be difficult to form the desired transverse anisotropy by cross-field annealing.

By use of magnetization, magnetostriction and Curie temperature data referred to above, the inventors have identified the following range of relatively iron-rich (and relatively low-cost) alloys as suitable for cross-field annealing to produce amorphous active elements for magnetomechanical markers having a suitably high ring down signal, low likelihood of causing false alarms in other types of EAS systems, and improved resonant frequency stability:

FeCoNiMBSiC, where "M" is one or more of the "early" transition metals Mn, Mo, Nb, Cr, Hf, Zr, Ta, V, and "M" ranges in total from about 2 to about 17 atomic percent; the proportion of iron ranges from about 45 to about 82 atomic percent; the proportion of cobalt ranges from zero to about 40 atomic percent; the proportion of nickel ranges from zero to about 30 atomic percent; the proportion of boron ranges from zero to about 28 atomic percent; the proportion of silicon ranges from zero to about 8 atomic percent; the proportion of carbon ranges from zero to about 4 atomic percent; the combined proportion of Mn, Mo, Nb, Cr, Ta and V (if any of these six elements is present) does not exceed about 10 atomic percent; and the combined proportion of Zr and Hf (if either of these two elements is present) does not exceed about 15 atomic percent.

Figure 7:
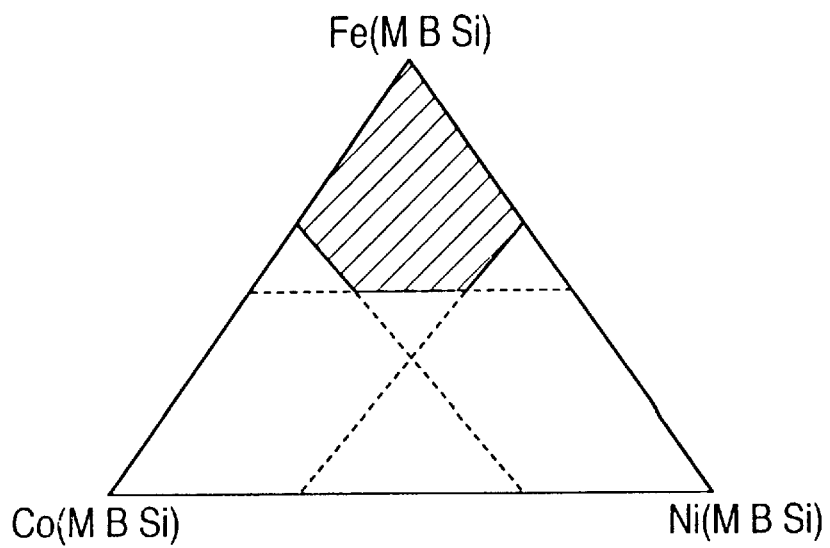
FIG. 7 is a ternary diagram for the (Fe—Co—Ni)-(early-transition-metal-B—Si) system indicating a preferred range of amorphous alloys according to the present invention.

FIG. 7 is a ternary diagram which illustrates relative proportions of Fe, Ni and Co in the alloys that are included in this range.

The following are examples of alloys that can be expected to be suitable for cross-field annealing treatment to produce active elements in accordance with the invention:

$Fe_{82}Co_5B_{10}Zr_3$, $Fe_{82}Co_5B_{10}Zr_2Nb_1$, $Fe_{80}Co_5Ni_5B_6Zr_4$, $Fe_{77}Zr_3B_{20}$, $Fe_{77}Zr_3B_{18}Si_2$, $Fe_{77}Nb_3B_{18}Si_2$, $Fe_{76}Co_6Ni_6B_8Zr_4$, $Fe_{75}Co_6Ni_6B_9Zr_4$, $Fe_{70}Co_6Ni_{10}B_{10}Zr_4$, $Fe_{70}Ni_{10}B_{16}Zr_4$, $Fe_{70}Zr_4B_{26}$, $Fe64Co_{20}B_{10}Zr_6$, $Fe_{63}Co_{13}Ni_{10}Zr_{14}$, $Fe_{60}Co_{10}Ni_{16}Zr_{14}$, $Fe_{60}Co_{10}Ni_{16}B_{10}Zr_4$, $Fe_{60}Co_{15}Ni_5Zr_6B_8Si_6$, $Fe_{50}Co_{14}Ni_{14}Zr_4B_{15}Si_3$ (all proportions in atomic percent).

The presence of at least a few percent of early transition metals (ETM) reduces magnetostriction and aids in constraining k to the optimal range of about 0.28 to 0.40. In addition, the inclusion of small concentration of ETM increases electrical resistivity which reduces eddy current loss and enhances the Q of the active element.

Inclusion of ETM brings the potential disadvantages of reduced saturation magnetization, lower Tc and increased melt temperature. It is desirable to minimize or compensate for these disadvantages by various techniques. The reduction in saturation magnetization can be minimized by using Zr and/or Hf in preference to the other ETMs listed above. The reduction in Tc can be offset by adding Co and/or Ni. (The presence of Co or Ni also adds to the species differentiation needed for ordered-pair anisotropy induced by field annealing.) The increased melt temperature, which makes ribbon formation more difficult, can be offset by adding B and/or Si. Adding B and/or Si to (Fe, Co, Ni) Zr also raises Tc and saturation magnetization and magnetostriction. When neither Co nor Ni is present, room temperature magnetization increases with (B, Si)>20 atomic percent because of the resulting increase in Tc.

A narrower range of preferred alloys according to the invention, having a desirably high Curie temperature and substantially corresponding to the region 100 in FIG. 6B, is defined as Fe(M1) (M2) (M3), where M1 is one or both of Co and Ni; M2 is one or more of Mn, Mo, Nb, Cr, Hf, Zr, Ta, V; M3 is one or both of B and Si; the proportion of iron ranges from about 50 to about 75 atomic percent; the proportion of M1 ranges from about 15 to about 35 atomic percent; the proportion of M2 ranges from about 3 to about 12 atomic percent; and the proportion of M3 ranges from zero to about 20 atomic percent. A small amount of carbon, up to about 4 atomic percent may also be included.

Another narrower range of preferred alloys according to the invention, in which the iron content is particularly high and which are correspondingly low in cost, is defined as FeMBSi, where M is one or more of Mn, Mo, Nb, Cr, Hf, Zr, Ta, V; the proportion of iron ranges from about 70 to about 80 atomic percent; the proportion of M ranges from about 2 to about 8 atomic percent; the proportion of boron ranges from about 15 to about 26 percent; and the proportion of silicon ranges from zero to about four atomic percent. Again, up to about four atomic percent of carbon may be included.

In the foregoing discussion, alloys to be used in accordance with the invention in forming the active element of a magnetomechanical EAS marker have been defined as including one or more of a group of early transition metals, namely Mn, Mo, Nb, Cr, Hf, Zr, Ta and V. However, these metals can be grouped into two different categories which have somewhat different properties. The first category, which will hereinafter be designated "TE1", consists of Zr, Hf and Ta; the second category, designated "TE2", consists of Mo, Mn, Cr, Nb and V.

The TE1 metals are more effective glass-forming elements than the TE2 metals. Consequently, one or more glass-forming metalloids such as B, Si, Ge, P and C must be included to produce a satisfactory amorphous ribbon if only the TE2 metals are included. This is significant in terms of magnetic properties because increasing the concentration of B tends to depress the saturation moment $n_B$, which may lead to lower saturation magnetization $M_S$ at room temperature.

The TE1 metals also have different magnetic properties as compared to the TE2 metals. Increasing TE1 concentration increases the Curie temperature $T_C$ for a given Fe-rich (FeNiCo) composition, but increasing TE2 concentration for the same composition stabilized with boron reduces $T_C$, leading to a reduction in room temperature magnetization.

On the other hand, if a TE2 element is introduced into FeNiCoB to achieve reduced magnetostriction relative to $Fe_{80}B_{20}$, the accompanying loss of saturation magnetization is less than would result if a TE1 element such as Zr were employed to obtain the same reduction in magnetostriction.

Accordingly, another preferred range of compositions suitable for use as the active element in a magnetomechanical EAS marker is defined as $(FeNiCo)_{100-x-z}TE1_xM_z$, where all proportions are expressed in atomic percent, M is one or more of B, Si, Ge, C and P; $5 \leq x \leq 16$; $0 \leq z \leq 12$; the proportion of Fe in the alloy is at least 40% of (100–x–z); the proportion of Co in the alloy is no more than 40% of (100–x–z); and the proportion of Ni in the alloy is no more than 40% of (100–x–z). It is particularly preferred that the proportion of Fe be at least 60%, 80% or 90% of (100–x–z).

It will be noted that the FeNiCo-TE1 alloy range described above contemplates either no metalloid or a relatively small proportion (less than 8%) metalloid. Moreover, a lower concentration of TE1 glass-former (e.g. 10%) is required for stable glassification as compared to using metalloid as the glass-forming element, in which case about 14 to 28% glass-former is required to achieve a like degree of stabilization.

Suitable examples of alloys in this preferred range are Fe-rich $(FeNiCo)_{90}Zr_{10}$ amorphous alloys discussed in the above-referenced Ohnuma article. Although alloys in this range have been previously reported, it has not heretofore been recognized that such alloys are suitable for use, after cross-field annealing, as the active element in a magneto-mechanical EAS marker.

Another preferred range of alloys suitable for use as the active element in a magnetomechanical EAS marker includes a TE2 metal or metals as the only early transition elements. This range is defined as $(FeNiCo)_{100-y-z}TE2_yM_z$, where all proportions are expressed in atomic percent, M is one or more of B, Si, Ge, C and P; $2 \leq y \leq 14$; $4 \leq z \leq 16$; $y+z \leq 25$; and the proportion of Fe is at least two-thirds of (100–y–z). It will be noted that the Fe content of the alloys in this range is at least 50 atomic percent. Examples of alloys in this range are $Fe_{80}Nb_4B_{16}$, $Fe_{72}Co_{14}Nb_6B_4Ge_4$ and $Fe_{80}Cr_6B_{14}$. Additional preferred ranges call for the proportion of Fe to be at least 60%, 80% or 90% of (100–y–z).

Alloys in the TE2-only range defined in the preceding paragraph have been previously been reported but have not heretofore been recognized as suitable for use as the active element in a magnetomechanical EAS marker after cross-field annealing.

A third preferred range of alloys includes at least one member from each of the TE1 and TE2 categories and is believed to be novel. This range is defined as $(FeNiCo)_{100-x-y-z}TE1_xTE2_yM$; where $5 \leq x \leq 16$; $2 \leq y \leq 12$; $4 \leq z \leq 16$; $x+y \leq 20$; $x+y+z \leq 30$; M is one or more of B, Si, Ge, C and P, and all proportions are expressed in atomic percent. According to preferred ranges within this range of alloys, the proportion of Fe may be at least 40%, 60%, 80% or 90% of (100–x–y–z). An example of an alloy in this range is $Fe_{86}Zr_5Cr_4B_5$.

It will be recognized that this range is arrived at by adding TE2 and metalloid constituents to the TE1-only range discussed previously. The addition of TE2 and metalloid elements ameliorates the suppression in Curie temperature and saturation magnetization caused by including a TE1 element or elements in an Fe-rich composition. At the same time the increased chemical stability, electrical resistivity and mechanical hardness provided by TE1 content can be substantially retained. Although increasing TE2 content does tend to depress magnetic moment, this effect is not as great as when TE1 alone is used to stabilize the alloy, perhaps because of the presence of metalloids with the TE2.

Moreover, the increased compositional complexity provided in the FeNiCo-TE1-TE2-metalloid alloys makes it easier to form and stabilize the desired metallic glass. Also, the ability to vary the larger number of constituent elements, which have differing effects on magnetic and mechanical properties, permits greater control of these properties. Because of the amorphous form of the material, the individual properties of the constituents tend to result in a more nearly linear combination of properties than would be the case for a crystalline material. In crystalline alloys, structural phase changes tend to cause discontinuous changes in properties as constituents are varied.

Amorphous strips of alloys in the novel TE1–TE2 range disclosed above may be cross-field annealed and then employed in accordance with the invention as active elements for magnetomechanical EAS markers. It is also contemplated to use amorphous materials in that range in other applications which require low magnetostriction and soft magnetic properties. Such applications include thin magnetic films for shields, biasing elements in magnetic recording read or write heads, magnetic random access memories, and other sensor applications.

Figure 8:
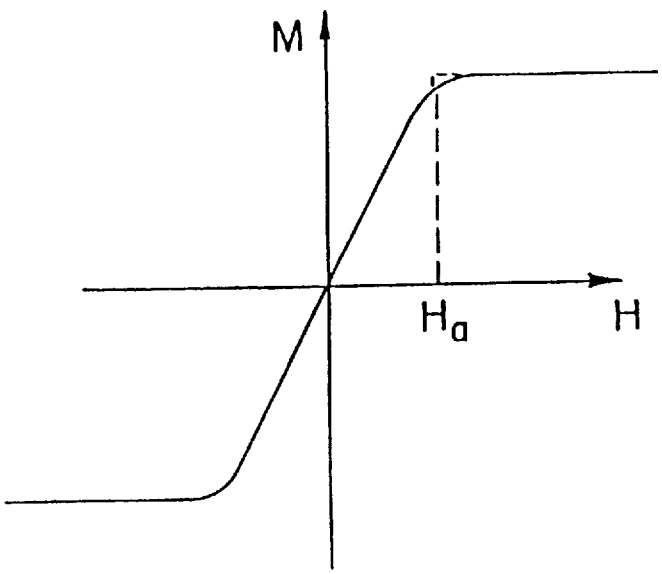
FIG. 8 illustrates an M-H loop characteristic of an active element for a magnetomechanical marker provided in accordance with the invention.

For use as the active element in a magnetomechanical EAS marker, a composition selected from the preferred range is to be transverse-field-annealed to generate a transverse anisotropy with a desired anisotropy field $H_a$ in the range of about 6 Oe to 12 Oe and preferably 6–8 Oe. The anisotropy field $H_a$ essentially corresponds to the "knee" portion of the M-H loop, as shown in FIG. 8.

The annealing temperature and time can be selected to provide the desired anisotropy field $H_a$ according to the characteristics of the selected material. Annealing a material at its Curie temperature Tc or above produces no magnetic-field-induced anisotropy. The selected annealing temperature $T_a$ must therefore be below Tc for the selected material. The composition of the material may be adjusted, according to known techniques, to set the Curie temperature Tc at an appropriate point. Preferably Tc is in the range 380°–480° C. A preferred value of Tc is 450° C. It is preferred that annealing be carried out at a temperature from 10° C. to 100° C. less than Tc for a time in the range of 10 seconds to 10 minutes, depending on the annealing temperature selected.

Figure 9:
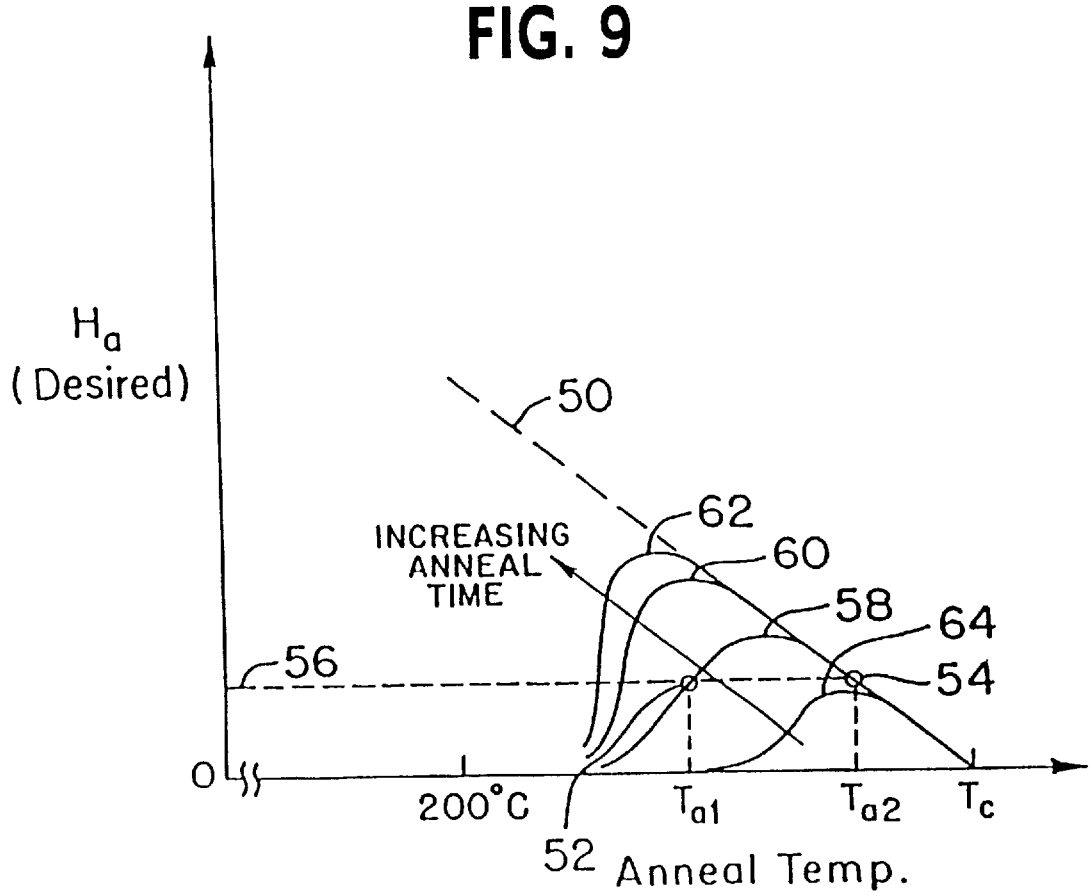
FIG. 9 illustrates variations in induced anisotropy according to changes in the temperature employed during cross-field annealing.

FIG. 9 illustrates how the resulting anisotropy field $H_a$ varies with annealing temperature and annealing time. For a given annealing temperature, a higher level of $H_a$ is achieved as the annealing time is increased, up to a limit indicated by line 50 in FIG. 10. The maximum level of $H_a$ that can be achieved for a selected annealing temperature generally increases as the difference between the annealing temperature and the Curie temperature Tc increases. However, if the selected annealing temperature is too low to provide a sufficient amount of atomic relaxation in a reasonable time, then the anisotropy field $H_a$ will fail to reach its equilibrium strength indicated by line 50.

For a given desired level of $H_a$, there are two different annealing temperatures that may be selected for a given annealing time, as indicated at points 52 and 54, corresponding to annealing temperatures $T_{a1}$ and $T_{a2}$, respectively, either of which may be selected to produce the $H_a$ level indicated by line 56 for the annealing time indicated by curve 58. Longer annealing times, represented by curves 60 and 62, would produce higher levels of $H_a$ if the temperature $T_{a1}$ were selected, but not if the temperature $T_{a2}$ were selected. A shorter annealing time, indicated by curve 64, would come close to producing the level of $H_a$ indicated by line 56 if the annealing temperature were $T_{a2}$, but would substantially fail to produce any field-induced anisotropy if temperature $T_{a1}$ were selected.

It is within the scope of the present invention to employ current-annealing and other heat-treatment practices in connection with the compositions disclosed herein, in addition to or in place of the transverse-field annealing described just above.

It is contemplated that the active elements produced in accordance with the present invention may be incorporated in magnetomechanical markers formed with conventional housing structures and including conventional bias elements. Alternatively, the bias elements may be formed of a low coercivity material such as those described in U.S. Pat. No. 5,729,200 (which has common inventors and a common assignee with the present application). One such low coercivity material is designated as "MagnaDur 20-4", commercially available from Carpenter Technology Corporation, Reading, Pa. It is particularly advantageous to use active elements provided according to the present invention with a low-coercivity bias element because such bias elements are more susceptible than conventional bias materials to suffering a small decrease in magnetization upon exposure to relatively low level alternating magnetic fields. Although the low-coercivity bias elements are therefore somewhat likely to vary in a small way in terms of actual bias field provided by the bias element, such minor variations will not significantly shift the resonant frequency of the active elements provided in accordance with the present invention.

As another alternative technique for providing the bias field, it is contemplated to apply an invention described in the above-referenced co-pending U.S. patent application Ser. No. 08/800,772, entitled "Active Element for Magnetomechanical EAS Marker Incorporating Particles of Bias Material," filed on Feb. 14, 1997, and having common inventors with the present application. According to the '772 application, crystals of semi-hard or hard magnetic material are formed within the bulk of an amorphous magnetically-soft active element, and the crystals are magnetized to provide a suitable bias field. No separate bias element would be required with such an active element.

Various changes in the above-disclosed embodiments may be introduced without departing from the invention. The particularly preferred embodiments of the invention are thus intended in an illustrative and not limiting sense. The true spirit and scope of the invention are set forth in the following claims.

What is claimed is:

1. A magnetomechanical EAS marker, comprising:
   an active element in the form of a strip of amorphous magnetostrictive metal alloy having a composition essentially of $Fe_aCo_bNi_cM_dB_eSi_fC_g$; and
   means for applying a magnetic bias at a level $H_B$ to said active element, $H_B$ being greater than 3 Oe;
   said active element having been annealed to relieve stress therein and having a magnetomechanical coupling factor k, such that $0.28 \leq k \leq 0.4$ at the applied bias level $H_B$;
   with $45 \leq a \leq 82$; $0 \leq b \leq 40$; $0 \leq c \leq 30$; $2 \leq d \leq 17$; $0 \leq e \leq 28$; $0 \leq f \leq 8$; $0 \leq g \leq 4$ (a–g in atomic percent); and M is one or more of Mn, Mo, Nb, Cr, Hf, Zr, Ta, V; provided that:
   (i) the combined proportion of Mn, Mo, Nb, Cr, Ta, V, if present, does not exceed 10%; and
   (ii) the combined proportion of Zr and Hf, if present, does not exceed 15%.

2. A magnetomechanical EAS marker according to claim 1, wherein $a \geq 50$.

3. A magnetomechanical EAS marker according to claim 2, wherein $a \geq 55$.

4. A magnetomechanical EAS marker according to claim 3, wherein $a \geq 60$.

5. A magnetomechanical EAS marker according to claim 4, wherein $a \geq 65$.

6. A magnetomechanical EAS marker according to claim 5, wherein $a \geq 70$.

7. A magnetomechanical EAS marker according to claim 1, wherein $b+c \geq 10$.

8. A magnetomechanical EAS marker according to claim 7, wherein b, $c \geq 5$.

9. A magnetomechanical EAS marker according to claim 8, wherein $b+c \geq 20$.

10. A magnetomechanical EAS marker according to claim 1, wherein M is exclusively Zr.

11. A magnetomechanical EAS marker according to claim 10, wherein $d \geq 8$.

12. A magnetomechanical EAS marker according to claim 11, wherein e, f, g=0.

13. A magnetomechanical EAS marker according to claim 10, wherein b, c, f, g=0.

14. A magnetostrictive element for use as an active element in a magnetomechanical electronic article surveillance marker, said element being a strip of amorphous metal alloy, said element having been annealed so as to relieve stress in said element, said element having a magnetomechanical coupling factor k in a range of about 0.28 to 0.4 at a bias field level that corresponds to a minimum resonant frequency of said element, said alloy having a composition essentially of $Fe_aCo_bNi_cM_dB_eSi_fC_g$;
   with $45 \leq a \leq 82$; $0 \leq b \leq 40$; $0 \leq c \leq 30$; $2 \leq d \leq 17$; $0 \leq e \leq 28$; $0 \leq f \leq 8$; $0 \leq g \leq 4$ (a–g in atomic percent); and M is one or more of Mn, Mo, Nb, Cr, Hf, Zr, Ta, V; provided that:
   (i) the combined proportion of Mn, Mo, Nb, Cr, Ta, V, if present, does not exceed 10%; and
   (ii) the combined proportion of Zr and Hf, if present, does not exceed 15%.

15. A magnetostrictive element according to claim 14, wherein $a \geq 50$.

16. A magnetostrictive element according to claim 15, wherein $a \geq 55$.

17. A magnetostrictive element according to claim 16, wherein $a \geq 60$.

18. A magnetostrictive element according to claim 17, wherein $a \geq 65$.

19. A magnetostrictive element according to claim 18, wherein $a \geq 70$.

20. A magnetostrictive element according to claim 14, wherein $b+c \geq 10$.

21. A magnetostrictive element according to claim 15, wherein b, $c \geq 5$.

22. A magnetostrictive element according to claim 21, wherein $b+c \geq 20$.

23. A magnetostrictive element according to claim 14, wherein M is exclusively Zr.

24. A magnetostrictive element according to claim 23, wherein $d \geq 8$.

25. A magnetostrictive element according to claim 24, wherein e, f, g=0.

26. A magnetostrictive element according to claim 23, wherein b, c, f, g=0.

27. A magnetomechanical EAS marker, comprising:
an active element in the form of a strip of amorphous magnetostrictive metal alloy having a composition essentially of $Fe_aM1_bM2_cM3_dC_e$; and
means for applying a magnetic bias at a level $H_B$ to said active element, $H_B$ being greater than 3 Oe;
said active element having been annealed to relieve stress therein and having a magnetomechanical coupling factor k, such that $0.28 \leq k \leq 0.4$ at the applied bias level $H_B$;
with M1 being one or both of Co and Ni; M2 being one or more of Mn, Mo, Nb, Cr, Hf, Zr, Ta, V; M3 being one or both of B and Si; $50 \leq a \leq 75$; $15 \leq b \leq 35$; $3 \leq c \leq 12$; $0 \leq d \leq 20$; $0 \leq e \leq 4$ (a–e in atomic percent).

28. A magnetomechanical EAS marker according to claim 27, wherein $a \geq 60$.

29. A magnetomechanical EAS marker according to claim 28, wherein said alloy includes cobalt in the proportion of at least about 15 atomic percent.

30. A magnetomechanical EAS marker according to claim 29, wherein said proportion of cobalt does not exceed about 25 atomic percent.

31. A magnetomechanical EAS marker according to claim 27, wherein M2 is exclusively Zr.

32. A magnetomechanical EAS marker according to claim 28, wherein $c \geq 8$.

33. A magnetomechanical EAS marker according to claim 28, wherein $d \geq 10$.

34. A magnetostrictive element for use as an active element in a magnetomechanical electronic article surveillance marker, said element being a strip of amorphous metal alloy, said element having been annealed so as to relieve stress in said element, said element having a magnetomechanical coupling factor k in a range of about 0.28 to 0.4 at a bias field level that corresponds to a minimum resonant frequency of said element, said alloy having a composition essentially of $Fe_aM1_bM2_cM3_dC_e$;
with M1 being one or both of Co and Ni; M2 being one or more of Mn, Mo, Nb, Cr, Hf, Zr, Ta, V; M3 being one or both of B and Si; $50 \leq a \leq 75$; $15 \leq b \leq 35$; $3 \leq c \leq 12$; $0 \leq d \leq 20$; $0 \leq e \leq 4$ (a–e in atomic percent).

35. A magnetostrictive element according to claim 34, wherein $a \geq 60$.

36. A magnetostrictive element according to claim 35, wherein said alloy includes cobalt in the proportion of at least about 15 atomic percent.

37. A magnetostrictive element according to claim 36, wherein said proportion of cobalt does not exceed about 25 atomic percent.

38. A magnetostrictive element according to claim 34, wherein M2 is exclusively Zr.

39. A magnetostrictive element according to claim 35, wherein $c \geq 8$.

40. A magnetostrictive element according to claim 35, wherein $d \geq 10$.

41. A magnetomechanical EAS marker, comprising:
an active element in the form of a strip of amorphous magnetostrictive metal alloy having a composition essentially of $Fe_aM_bB_cSi_dC_e$; and
means for applying a magnetic bias at a level $H_B$ to said active element, $H_B$ being greater than 3 Oe;
said active element having been annealed to relieve stress therein and having a magnetomechanical coupling factor k, such that $0.28 \leq k \leq 0.4$ at the applied bias level $H_B$;
with M being one or more of Mn, Mo, Nb, Cr, Hf, Zr, Ta, V; $70 \leq a \leq 80$; $2 \leq b \leq 8$; $15 \leq c \leq 26$; $0 \leq d \leq 4$; $0 \leq e \leq 4$ (a–e in atomic percent).

42. A magnetomechanical EAS marker according to claim 41, wherein $a \geq 75$.

43. A magnetomechanical EAS marker according to claim 41, wherein $c+d \geq 20$.

44. A magnetostrictive element for use as an active element in a magnetomechanical electronic article surveillance marker, said element being a strip of amorphous metal alloy, said element having been annealed so as to relieve stress in said element, said element having a magnetomechanical coupling factor k in a range of about 0.28 to 0.4 at a bias field level that corresponds to a minimum resonant frequency of said element, said alloy having a composition essentially of $Fe_aM_bB_cSi_dC_e$;
with M being one or more of Mn, Mo, Nb, Cr, Hf, Zr, Ta, V; $70 \leq a \leq 80$; $2 \leq b \leq 8$; $15 \leq c \leq 26$; $0 \leq d \leq 4$; $0 \leq e \leq 4$ (a–e in atomic percent).

45. A magnetostrictive element according to claim 44, wherein $a \geq 75$.

46. A magnetostrictive element according to claim 44, wherein $c+d \geq 20$.

47. A magnetomechanical EAS marker, comprising:
an active element in the form of a strip of amorphous magnetostrictive metal alloy having a composition essentially of $(FeNiCo)_{100-x-z}TE1_xM_z$; where TE1 is one or more of Zr, Hf, Ta; and M is one or more of B, Si, Ge, C, P; x, z and (100–x–z) all being atomic percent; and
means for applying a magnetic bias at a level $H_B$ to said active element, $H_B$ being greater than 3 Oe;
said active element having been annealed to relieve stress therein and having a magnetomechanical coupling factor k, such that $0.28 \leq k \leq 0.4$ at the applied bias level $H_B$;
with $5 \leq x \leq 16$ and $0 \leq z \leq 12$;
provided that:
(i) the proportion of Fe in said alloy is at least $0.4 \times (100-x-z)$;
(ii) the proportion of Co in said alloy is less than $0.4 \times (100-x-z)$; and
(iii) the proportion of Ni in said alloy is less than $0.4 \times (100-x-z)$.

48. A magnetomechanical EAS marker according to claim 47, wherein the proportion of Fe in said alloy is at least $0.6 \times (100-x-z)$.

49. A magnetomechanical EAS marker according to claim 48, wherein the proportion of Fe in said alloy is at least $0.8 \times (100-x-z)$.

50. A magnetomechanical EAS marker according to claim 49, wherein the proportion of Fe in said alloy is at least $0.9 \times (100-x-z)$.

51. A magnetomechanical EAS marker according to claim 47, wherein TE1 is exclusively Zr.

52. A magnetostrictive element for use as an active element in a magnetomechanical electronic article surveillance marker, said element being a strip of amorphous metal alloy, said element having been annealed so as to relieve stress in said element, said element having a magnetomechanical coupling factor k in a range of about 0.28 to 0.4 at a bias field level that corresponds to a minimum resonant frequency of said element, said alloy having a composition essentially of $(FeNiCo)_{100-x-z}TE1_xM_z$; where TE1 is one or more of Zr, Hf, Ta; and M is one or more of B, Si, Ge, C, P; x, z and (100–x–z) all being atomic percent with $5 \leq x \leq 16$ and $0 \leq z \leq 12$;
provided that:
(i) the proportion of Fe in said alloy is at least $0.4 \times (100-x-z)$;

(ii) the proportion of Co in said alloy is less than 0.4×(100−x−z); and (iii) the proportion of Ni in said alloy is less than 0.4×(100−x−z).

53. A magnetostrictive element according to claim 52, wherein the proportion of Fe in said alloy is at least 0.6×(100−x−z).

54. A magnetostrictive element according to claim 53, wherein the proportion of Fe in said alloy is at least 0.8×(100−x−z).

55. A magnetostrictive element according to claim 54, wherein the proportion of Fe in said alloy is at least 0.9×(100−x−z).

56. A magnetostrictive element according to claim 52, wherein TE1 is exclusively Zr.

57. A magnetomechanical EAS marker, comprising:

an active element in the form of a strip of amorphous magnetostrictive metal alloy having a composition essentially of $(FeNiCo)_{100-y-z}TE2_yM_z$; where TE2 is one or more of Cr, Nb, Mo, Mn, V; and M is one or more of B, Si, Ge, C, P; y, z and (100−y−z) all being atomic percent; and means for applying a magnetic bias at a level $H_B$ to said active element, $H_B$ being greater than 3 Oe;

said active element having been annealed to relieve stress therein and having a magnetomechanical coupling factor k, such that $0.28 \leq k \leq 0.4$ at the applied bias level $H_B$;

with $2 \leq y \leq 14$; $4 \leq z \leq 16$; and $y+z \leq 25$;

provided that the proportion of Fe in said alloy is at least two-thirds of (100−y−z).

58. A magnetomechanical EAS marker according to claim 57, wherein the proportion of Fe in said alloy is at least 0.8×(100−y−z).

59. A magnetomechanical EAS marker according to claim 58, wherein the proportion of Fe in said alloy is at least 0.9×(100−y−z).

60. A magnetostrictive element for use as an active element in a magnetomechanical electronic article surveillance marker, said element being a strip of amorphous metal alloy, said element having been annealed so as to relieve stress in said element, said element having a magnetomechanical coupling factor k in a range of about 0.28 to 0.4 at a bias field level that corresponds to a minimum resonant frequency of said element, said alloy having a composition essentially of $(FeNiCo)_{100-y-z}TE2_yM_z$; where TE2 is one or more of Cr, Nb, Mo, Mn, V; and M is one or more of B, Si, Ge, C, P; y, z and (100−y−z) all being atomic percent with $2 \leq y \leq 14$; $4 \leq z \leq 16$; and $y+z \leq 25$;

provided that the proportion of Fe in said alloy is at least two-thirds of (100−y−z).

61. A magnetostrictive element according to claim 60, wherein the proportion of Fe in said alloy is at least 0.8×(100−y−z).

62. A magnetostrictive element according to claim 61, wherein the proportion of Fe in said alloy is at least 0.9×(100−y−z).

63. A magnetomechanical EAS marker, comprising:

an active element in the form of a strip of amorphous magnetostrictive metal alloy having a composition essentially of $(FeNiCo)_{100-x-y-z}TE1_xTE2_yM_z$; where TE1 is one or more of Zr, Hf, Ta; TE2 is one or more of Cr, Nb, Mo, Mn, V; and M is one or more of B, Si, Ge, C, P; x, y, z and (100−x−y−z) all being atomic percent; and means for applying a magnetic bias at a level $H_B$ to said active element, $H_B$ being greater than 3 Oe;

said active element having been annealed to relieve stress therein and having a magnetomechanical coupling factor k, such that $0.28 \leq k \leq 0.4$ at the applied bias level $H_B$;

with $5 \leq x \leq 16$; $2 \leq y \leq 12$; $4 \leq z \leq 16$; $x+y \leq 20$; $x+y+z \leq 30$;

provided that the proportion of Fe in the alloy is at least 0.4×(100−x−y−z).

64. A magnetomechanical EAS marker according to claim 63, wherein the proportion of Fe in said alloy is at least 0.6×(100−x−y−z).

65. A magnetomechanical EAS marker according to claim 64, wherein the proportion of Fe in said alloy is at least 0.8×(100−x−y−z).

66. A magnetomechanical EAS marker according to claim 65, wherein the proportion of Fe in said alloy is at least 0.9×(100−x−y−z).

67. A magnetomechanical EAS marker according to claim 63, wherein TE1 is exclusively Zr.

68. A magnetostrictive element for use as an active element in a magnetomechanical electronic article surveillance marker, said element being a strip of amorphous metal alloy, said element having been annealed so as to relieve stress in said element, said element having a magnetomechanical coupling factor k in a range of about 0.28 to 0.4 at a bias field level that corresponds to a minimum resonant frequency of said element, said alloy having a composition essentially of $(FeNiCo)_{100-x-y-z}TE1_xTE2_yM_z$; where TE1 is one or more of Zr, Hf, Ta; TE2 is one or more of Cr, Nb, Mo, Mn, V; and M is one or more of B, Si, Ge, C, P; x, y, z and (100−x−y−z) all being atomic percent; with $5 \leq x \leq 16$; $2 \leq y \leq 12$; $4 \leq z \leq 16$; $x+y \leq 20$; $x+y+z \leq 30$; provided that the proportion of Fe in the alloy is at least 0.4×(100−x−y−z).

69. A magnetostrictive element according to claim 68, wherein the proportion of Fe in said alloy is at least 0.6×(100−x−y−z).

70. A magnetostrictive element according to claim 69, wherein the proportion of Fe in said alloy is at least 0.8×(100−x−y−z).

71. A magnetostrictive element according to claim 70, wherein the proportion of Fe in said alloy is at least 0.9×(100−x−y−z).

72. A magnetostrictive element according to claim 68, wherein TE1 is exclusively Zr.

* * * * *

UNITED STATES PATENT AND TRADEMARK OFFICE
CERTIFICATE OF CORRECTION

PATENT NO. : 6,057,766
DATED : May 2, 2000
INVENTOR(S) : Robert C. O'Handley, et al.

It is certified that error appears in the above-identified patent and that said Letters Patent are hereby corrected as shown below:

Col. 7, line 67, delete "Fe64" and insert -- $Fe_{64}$ --.
Col. 11, line 58, delete "$C_q$" and insert -- $C_5$ --.

Signed and Sealed this

Twenty-second Day of May, 2001

Attest:

NICHOLAS P. GODICI

Attesting Officer

Acting Director of the United States Patent and Trademark Office